(12) United States Patent
Cardanha et al.

(10) Patent No.: US 12,047,065 B2
(45) Date of Patent: *Jul. 23, 2024

(54) TOUCH-BASED CONTROL DEVICE TO DETECT TOUCH INPUT WITHOUT BLIND SPOTS

(71) Applicant: Brilliant Home Technology, Inc., San Mateo, CA (US)

(72) Inventors: Brian Cardanha, San Mateo, CA (US); Bozhi See, San Mateo, CA (US); Michelle Pillainayagam, San Mateo, CA (US)

(73) Assignee: Brilliant Home Technology, Inc., San Mateo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/987,617

(22) Filed: Nov. 15, 2022

(65) Prior Publication Data

US 2023/0155587 A1    May 18, 2023

Related U.S. Application Data

(63) Continuation of application No. 17/142,102, filed on Jan. 5, 2021, now Pat. No. 11,528,028.

(60) Provisional application No. 62/957,302, filed on Jan. 5, 2020.

(51) Int. Cl.
*H03K 17/96* (2006.01)
*G08C 17/02* (2006.01)

(52) U.S. Cl.
CPC .......... *H03K 17/962* (2013.01); *G08C 17/02* (2013.01)

(58) Field of Classification Search
CPC .. H03K 17/962; G08C 17/02; G06F 3/03547; G06F 3/041; G06F 3/0412; G06F 3/0416; G06F 3/04166; G06F 3/044; G06F 3/0443; G06F 3/0445; G06F 3/0446; G06F 3/0488; G06F 3/04883
USPC ....................................... 340/12.22
See application file for complete search history.

(56) References Cited

U.S. PATENT DOCUMENTS

| | | |
|---|---|---|
| 9,208,676 B2 | 12/2015 | Fadell et al. |
| 9,614,690 B2 | 4/2017 | Ehsani et al. |
| 9,835,434 B1 | 10/2017 | Sloo |
| 10,375,897 B2 | 8/2019 | Reilly |
| 11,507,217 B2 | 11/2022 | Emigh |

(Continued)

FOREIGN PATENT DOCUMENTS

| | | |
|---|---|---|
| CN | 107229230 A | 10/2017 |
| EP | 3073338 A1 | 9/2016 |

(Continued)

OTHER PUBLICATIONS

Extended European Search Report dated Dec. 12, 2023, Application No. 21736185.6-1211 8 pages.

(Continued)

*Primary Examiner* — Brian A Zimmerman
*Assistant Examiner* — Thang D Tran
(74) *Attorney, Agent, or Firm* — Mahamedi IP Law LLP (57) ABSTRACT

A touch-based control device is operable to detect touch input over an entirety of the control device's exterior, including at regions of an exterior panel that (i) overlay portions of a circuit board where no touch sensors exist, and/or (ii) extend beyond a perimeter of a touch region or circuit board on which touch sensors are provided.

23 Claims, 7 Drawing Sheets

(56) References Cited

U.S. PATENT DOCUMENTS

| | | |
|---|---|---|
| 2002/0016639 A1 | 2/2002 | Smith |
| 2003/0040812 A1 | 2/2003 | Gonzales |
| 2006/0132303 A1 | 6/2006 | Stilp |
| 2006/0212136 A1 | 9/2006 | Lee |
| 2008/0158172 A1 | 7/2008 | Hotelling |
| 2008/0223706 A1* | 9/2008 | Hagiwara ............ H01H 25/041 327/517 |
| 2009/0158188 A1 | 6/2009 | Bray |
| 2010/0001746 A1 | 1/2010 | Duchene |
| 2010/0146423 A1 | 6/2010 | Duchene |
| 2011/0063224 A1 | 3/2011 | Vexo |
| 2011/0137836 A1 | 6/2011 | Kuriyama |
| 2012/0259992 A1 | 10/2012 | Koehler |
| 2012/0310415 A1 | 12/2012 | Raestik |
| 2013/0131839 A1 | 5/2013 | Washington |
| 2013/0157729 A1* | 6/2013 | Tabe ................. H04W 52/0245 977/932 |
| 2013/0187887 A1* | 7/2013 | Mizuhashi .......... G06F 3/04184 345/174 |
| 2013/0191233 A1 | 7/2013 | Atkinson |
| 2013/0198858 A1 | 8/2013 | Atkinson |
| 2013/0201151 A1* | 8/2013 | Takashima ............ G06F 3/0488 345/174 |
| 2013/0219520 A1 | 8/2013 | Atkinson |
| 2014/0006465 A1 | 1/2014 | Davis |
| 2014/0071588 A1* | 3/2014 | Chen ...................... H01L 28/40 361/313 |
| 2014/0108019 A1 | 4/2014 | Ehsani |
| 2014/0201666 A1 | 7/2014 | Bedikian |
| 2014/0225855 A1* | 8/2014 | Aitchison ............... G06F 3/041 345/173 |
| 2014/0253483 A1 | 9/2014 | Kupersztoch |
| 2014/0257532 A1 | 9/2014 | Kim |
| 2014/0266669 A1 | 9/2014 | Fadell |
| 2014/0292396 A1 | 10/2014 | Bruwer |
| 2015/0005952 A1 | 1/2015 | Sasaki |
| 2015/0077343 A1 | 3/2015 | Shao |
| 2015/0097780 A1 | 4/2015 | Hotelling |
| 2015/0156031 A1 | 6/2015 | Fadell |
| 2015/0163412 A1 | 6/2015 | Holley |
| 2015/0187209 A1 | 7/2015 | Brandt |
| 2015/0241860 A1 | 8/2015 | Raid |
| 2015/0256391 A1 | 9/2015 | Hardy |
| 2015/0293513 A1 | 10/2015 | Schlette |
| 2016/0012348 A1 | 1/2016 | Johnson et al. |
| 2016/0025367 A1 | 1/2016 | Matsuoka et al. |
| 2016/0043926 A1 | 2/2016 | Frei |
| 2016/0117019 A1* | 4/2016 | Takeda ..................... G06F 3/03 345/174 |
| 2016/0259308 A1 | 9/2016 | Fadell |
| 2016/0277203 A1 | 9/2016 | Jin |
| 2016/0277204 A1 | 9/2016 | Kang |
| 2016/0372138 A1 | 12/2016 | Shinkai |
| 2017/0005818 A1 | 1/2017 | Gould |
| 2017/0006504 A1 | 1/2017 | Townend |
| 2017/0017324 A1 | 1/2017 | O'Keeffe |
| 2017/0019265 A1 | 1/2017 | Hou |
| 2017/0026194 A1 | 1/2017 | Vijayrao et al. |
| 2017/0131891 A1 | 5/2017 | Novet |
| 2017/0195130 A1 | 7/2017 | Landow et al. |
| 2017/0205958 A1* | 7/2017 | Kurasawa ............. G06F 3/0448 |
| 2017/0220197 A1* | 8/2017 | Matsumoto ............ G06F 3/016 |
| 2017/0280274 A1 | 9/2017 | Notohardjono |
| 2017/0292712 A1 | 10/2017 | Alexander |
| 2017/0336902 A1* | 11/2017 | Smith ................... G06F 1/3203 |
| 2017/0339004 A1 | 11/2017 | Hall |
| 2017/0357439 A1 | 12/2017 | Lemay |
| 2017/0359190 A1 | 12/2017 | Nadathur |
| 2018/0052451 A1 | 2/2018 | Billi-Duran |
| 2018/0091326 A1 | 3/2018 | McLaughlin |
| 2018/0160284 A1 | 6/2018 | Lim |
| 2018/0160301 A1 | 6/2018 | Kwon |
| 2018/0181248 A1* | 6/2018 | Chang ................. G06F 3/04166 |
| 2018/0181849 A1 | 6/2018 | Cassidy |
| 2018/0191517 A1 | 7/2018 | Emigh |
| 2018/0292962 A1 | 10/2018 | Choi |
| 2018/0300645 A1 | 10/2018 | Segal |
| 2018/0323996 A1 | 11/2018 | Roman |
| 2019/0029096 A1 | 1/2019 | O'Driscoll et al. |
| 2019/0035567 A1* | 1/2019 | O'Keeffe ............... H04R 1/023 |
| 2019/0215184 A1 | 7/2019 | Emigh et al. |
| 2019/0229943 A1 | 7/2019 | Edwards |
| 2019/0265858 A1* | 8/2019 | Nishio ..................... G09G 3/36 |
| 2019/0280891 A1 | 9/2019 | Pognant |
| 2019/0371145 A1 | 12/2019 | McQueen et al. |
| 2020/0007356 A1 | 1/2020 | Mason |
| 2020/0028734 A1 | 1/2020 | Emigh et al. |
| 2020/0097112 A1* | 3/2020 | Seo ........................ G06F 3/044 |
| 2020/0210022 A1* | 7/2020 | Kim ..................... G06F 3/0418 |
| 2021/0019284 A1 | 1/2021 | Bowman |
| 2021/0194758 A1 | 6/2021 | Emigh |
| 2021/0208723 A1 | 7/2021 | Emigh |
| 2021/0208724 A1 | 7/2021 | Emigh |
| 2021/0210939 A1 | 7/2021 | Emigh |
| 2021/0211319 A1 | 7/2021 | See |
| 2021/0218399 A1 | 7/2021 | Cardanha |
| 2022/0006664 A1 | 1/2022 | Emigh |
| 2022/0224596 A1 | 7/2022 | Emigh |
| 2023/0019612 A1 | 1/2023 | See |
| 2023/0044270 A1 | 2/2023 | Emigh |

FOREIGN PATENT DOCUMENTS

| | | |
|---|---|---|
| EP | 3131235 A1 | 2/2017 |
| EP | 2887166 B1 | 7/2019 |
| WO | WO-2017/107521 | 6/2017 |
| WO | WO-2017/192752 | 11/2017 |
| WO | WO-2018/129105 | 7/2018 |
| WO | WO-2019/136440 | 7/2019 |
| WO | WO-2020/018995 | 1/2020 |

OTHER PUBLICATIONS

International Search Report and the Written Opinion of the International Searching Authority mailed Apr. 18, 2019, for related PCT Application No. PCT/US19/012698 filed Jan. 8, 2019, 7 pages.

International Search Report and the Written Opinion of the International Searching Authority mailed Nov. 14, 2019, for related PCT Application No. PCT/US19/42843 filed Jul. 22, 2019, 8 pages.

International Search Report and the Written Opinion of the International Searching Authority mailed Feb. 25, 2021, for related PCT Application No. PCT/US21/12214 filed Jan. 5, 2021, 8 pages.

Extended European Search Report dated Mar. 9, 2022, Application No. 19837970.3 11 pages.

* cited by examiner

TOUCH-BASED CONTROL DEVICE TO DETECT TOUCH INPUT WITHOUT BLIND SPOTS

RELATED APPLICATIONS

This application is a continuation of U.S. patent application Ser. No. 17/142,102, filed on Jan. 5, 2021; which claims benefit of priority to Provisional U.S. Patent Application No. 62/957,302, filed Jan. 5, 2020; the aforementioned applications being hereby incorporated by reference in their respective entireties.

TECHNOLOGICAL FIELD

Embodiments described herein relate to a touch-based control device to detect touch input.

BACKGROUND

Home control systems, such as lighting control systems used for lighting fixtures, include binary analog switches and analog dimmer switches that enable users to control one or more lights wired to an electrical box upon which such switches are connected. Furthermore, when a person wishes to activate or interact with home systems, the person typically must interact with an actual device of the system or a dedicated or universal remote control and manually create an environment comprising activated or dimmed lights, audio system output, visual system output (e.g., a television or digital picture frame output), temperature, and the like.

Touch sensitive sensing technology has emerged as a popular human interface for many types of devices. Many types of devices, such as portable computers, media players, and IOT devices, provide capacitive touch-sensing technology as a mechanism for enabling user input. Typically, touch-sensing functionality is implemented through use of a circuit board that distributes capacitive elements over an area of the circuit board.

Figure 5:
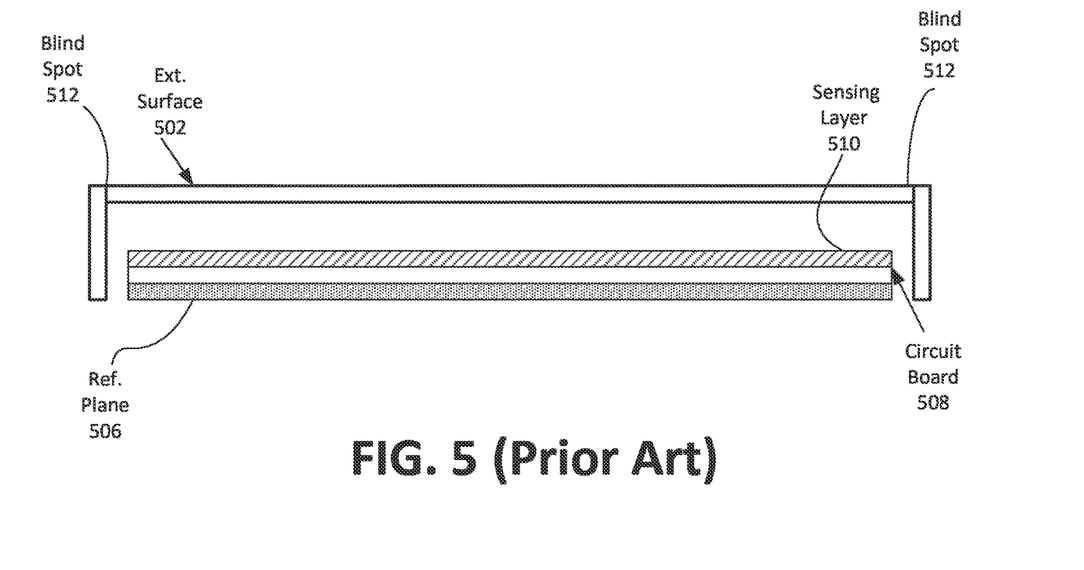
FIG. 5 illustrates a cross-sectional view of a prior art electronic device for detecting touch input.

FIG. 5 illustrates a cross-sectional view of a prior art electronic device 500 that includes a circuit board 508 on which a touch-sensing layer 510 is implemented to detect touch-input on an external surface 502. The circuit board 508 may also include a grounding layer, or reference plane 506, as an intermediate or bottom layer. The touch-sensing layer 510 can include capacitive elements distributed over an exterior-facing surface of the circuit board 508. The capacitive touch-sensing elements are reactive to changes in an electrical field that is generated over the respective element. Typically, each sensing element of the sensing layer 510 is reactive to electric field variations that occur directly over the sensing element. The circuit board 508 can further be provided with sensing logic (e.g., microprocessor) which can sample an output of each capacitive element of the sensing layer 510 to detect instances when the electric field of the sensing element are affected by capacitance inherent in human skin. Under such conventional approaches, the sensing logic can compare an input of the individual sensing elements with baseline values to detect the presence of human skin on or near the external surface 502.

Typically, the sensing layer 510 has substantially the same dimensions as the underlying reference plane 506. Additionally, the electric field that each sensing element is reactive to directly overlays the respective sensing element. Further, the sensing logic is tuned to interpret fluctuations in electric field that directly overlays individual sensing element as touch-input on the external surface 502. As a result, blind spots 512 can exist over portions of the external surface 502 that overlay (i) regions of the circuit board where no capacitive touch-sensing elements exist, and (ii) underlying regions where the circuit board itself is absent (e.g., regions beyond the perimeter of the circuit board). If a user touches the external surface 502 where there is a blind spot 512, the touch-input is not detected or registered as an input. As a result, under such conventional approaches, areas which are located beyond a perimeter of a touch region are not responsive to touch-input. Likewise, areas of the exterior surface 502 which overlay a region of a circuit board where no touch sensors are provided (e.g., region of circuit board where an antenna structure is provided) may also be non-responsive under conventional approaches.

BRIEF DESCRIPTION OF DRAWINGS

The disclosure herein is illustrated by way of example, and not by way of limitation, in the figures of the accompanying drawings in which like reference numerals refer to similar elements, and in which.

DETAILED DESCRIPTION

Embodiments include a touch-based control device that can detect touch input on regions of an exterior panel without so called "blind spots." In some examples, a touch-based control device is operable to detect touch input over an entirety of the control device's exterior, including at regions of an exterior panel that (i) overlay portions of a circuit board where no touch sensors exist, and/or (ii) extend beyond a perimeter of a touch region or circuit board on which touch sensors are provided.

In some variations, the control device is substantially touch-sensitive across an area of an external panel (e.g., the device is "touch-anywhere" responsive). Thus, the user can provide touch-input (e.g., tap) or initiate a gesture on a perimeter or corner region of the external panel to register input. Moreover, the touch-input on the perimeter or corner region of the external panel can be detected and processed so as to have the same effect as a touch-input that is more towards the center of the device.

The term "substantially" as used with examples herein means at least 90% of an indicated quantity (e.g., such as an area of an exterior panel).

In some examples, the control device is a wall-mounted device that can operate as or similar to a light switch to control one or multiple different devices (e.g., illumination device, smart device, etc.).

In examples, the control device operates to: (a) interpret any one of multiple possible touch-inputs of a user, and (b) generate one or more output control signals that are pre-associated with the interpreted touch-input. In examples, the multiple possible touch-inputs can correspond to gestures, such as tap actions (e.g., single, double, or triple (or more) tap), one or more long touches, and slides (e.g., continuous touching motion of user in leftward, rightward, upward or downward direction). Still further, gestures can include more complex motions, such as multi-directional inputs, or patterned inputs (e.g., long touch followed by short tap).

In some examples, the control device is a home device controller, such as an intelligent light switch that includes functionality for switching and dimming lights of a dwelling, as well as controlling operation of one or more connected devices (e.g., ceiling fan, thermostat, appliance, etc.). In such implementations, the control device can connect to the mains of the house, and/or communicate with connected devices through a wireless or wireline network or communication interface. A user can use touch-input to interact with the control device to control the operation of the connected devices.

In at least some examples, a control device includes at least one groove formed on the exterior panel to receive at least a first type of input. The groove can correlate to a region where one type of input is recognized or favored over another type of input. Additionally, the touch-sensitive panel includes one or more surrounding regions that are capable of receiving at least a second type of input.

Accordingly, in response to receiving touch-input, the control device performs an output function, such as to control one or more connected devices, either wired or wirelessly, based on the interpreted touch-input.

Figure 1A:
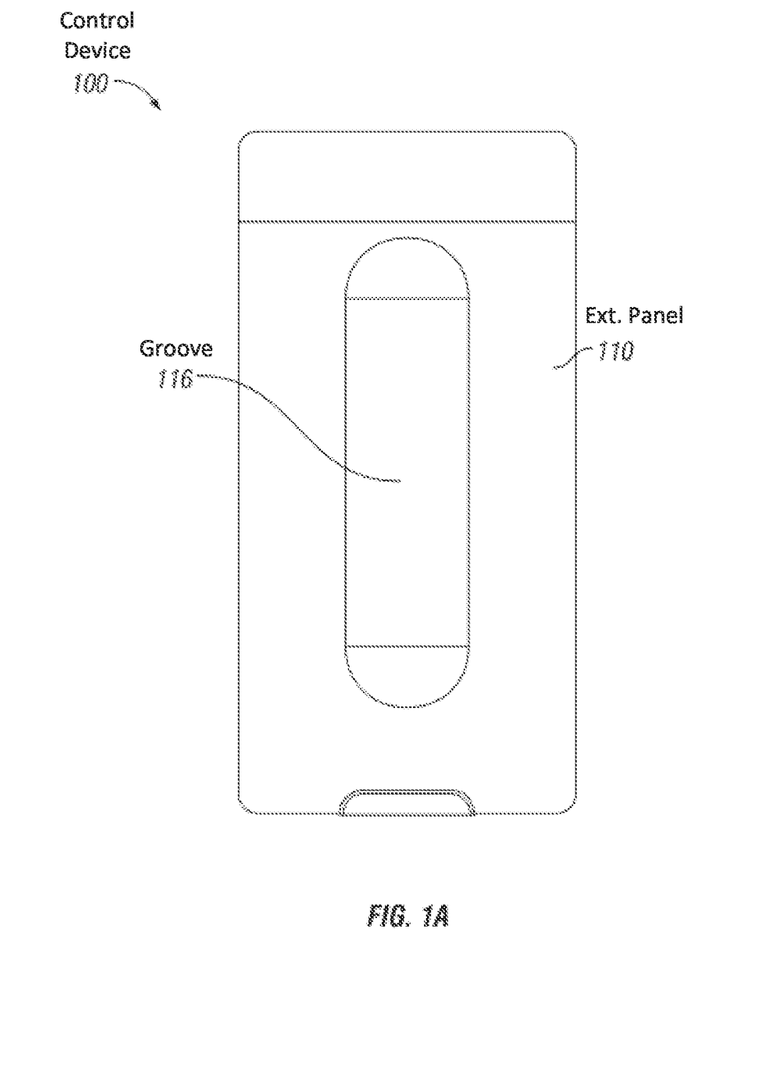
FIG. 1A illustrate a touch-based control device for controlling one or more connected devices, according to one or more examples.

FIG. 1A illustrates an electronic device for controlling one or more connected devices, according to one or more examples. As described, the control device 100 is configured to provide touch-anywhere sensing for detecting one or multiple types of touch-input. With reference to an example of FIG. 1A, the control device 100 includes sensing capabilities to enable touch-input detection and recognition at any location of an exterior panel 110. Additionally, the sensing capabilities of the control device 100 can detect multiple types of input, such as, for example, swipes, taps, multiple taps, pattern-touches, or other combinations. The control device 100 can correlate detected touch-inputs to particular output signals that affect the operation of a connected device. In some examples, the control device 100 is in form of a light switch that can detect and interpret a particular touch-input to control the operation of a set of illumination devices. The sensing capabilities of the control device 100 can detect and interpret one or more touch-inputs of multiple types to control, for example, a power state (e.g., on/off), brightness (e.g., dimming level), hue, blink pattern or other illumination attribute of one or more of the connected illumination devices.

In variations, the control device 100 can connect to and control other types of connected devices, such as ceiling fans, appliances, thermostats, audio/video devices, etc. In such variations, the sensing capabilities of the control device 100 can detect and interpret different inputs that result in output signals to control operation of such other types of devices (e.g., on/off, speed control for ceiling fan, connected device setting, etc.).

In examples as shown, control device 100 includes an exterior panel 110 to receive touch-input from a user. The exterior panel 110 can include one or multiple sensing zones where the control device 100 detects, or is more likely to detect particular types of touch-inputs. In some examples, the exterior panel 110 includes a groove 116, corresponding to a vertically elongated indentation or recess on the exterior panel 110. As described in greater detail, groove 116 is an example of a zone or region on exterior panel 110 where a particular type of touch-input is detectable, or more likely to be detected, as compared to a non-groove region of the exterior panel 110. In variations, the control device may not have a groove 116. For example, the control device 100 may be planar. Furthermore, the control device can include other types of input/output features, such as a display.

As shown, the control device 100 can be installed as a wall-mounted light controller for a room. In such implementations, the control device 100 can control (i) one or more connected lights (e.g., set of lights in a room) using electrical and switching components, and/or (ii) other connected devices using wireline or wireless communications. As a light controller, for example, the control device 100 can interpret a first user gesture as on/off input, in which case the control device 100 can cause a connected light to switch on or off. Additionally, the control device 100 can interpret a second gesture as dimming control, in which case the control device can implement dimming control on a connected light. The on/off and/or dimming control can be implemented through the control device 100 interfacing with electrical and switching components that connect to the target lights. In variations, the control device 100 can detect touch-input to similarly control other types of connected devices using a wireline or wireless channel.

Figure 1B:
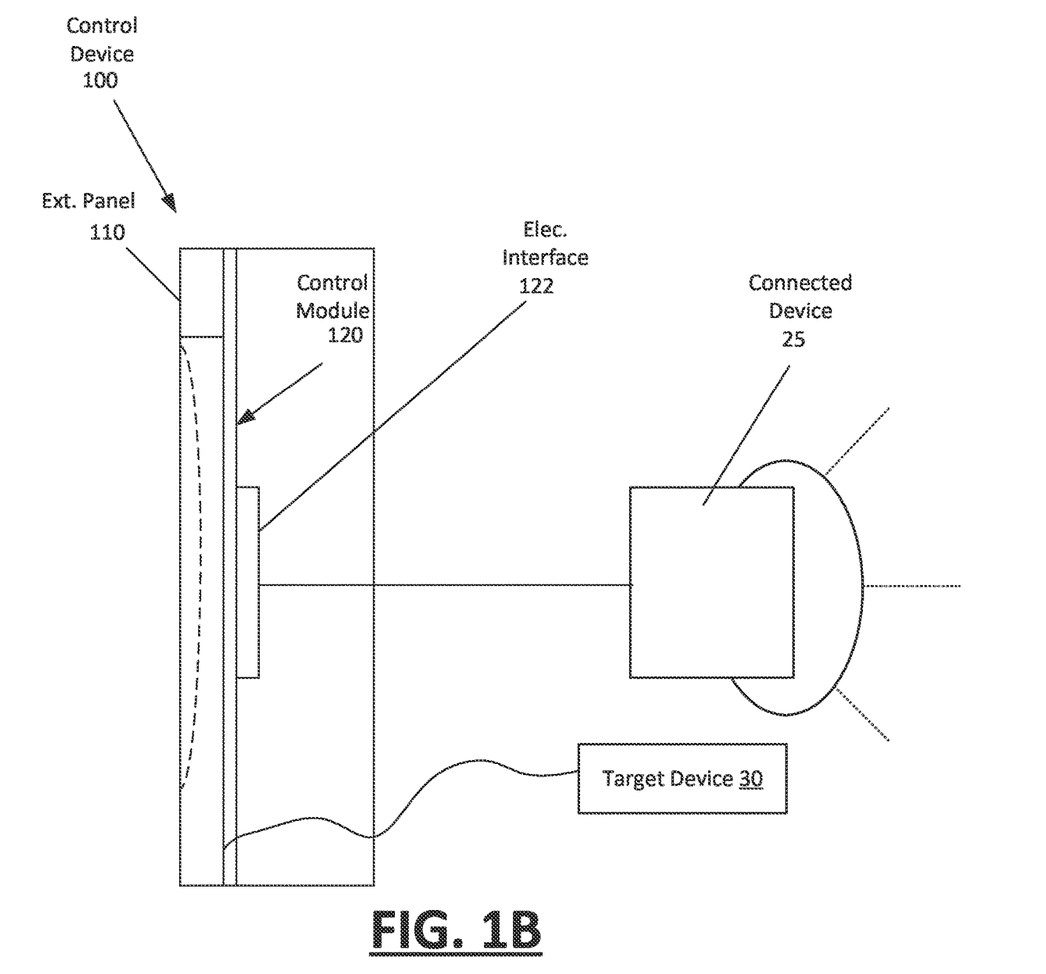
FIG. 1B illustrates is a side view of the touch-based control device of FIG. 1A, according to one or more examples.

FIG. 1B illustrates is a side view of control device 100 that is installed on a wall surface (e.g., dwelling). The control device 100 includes external panel 110, a control module 120, a housing 118 for the control module, and an electrical interface 122. When the control device 100 is mounted and installed in an electrical box, the interface 122 electrically connects to the electrical and switching elements of a dwelling. The control module 120 can be retained within the housing 118, which in turn can be inset within a receptacle of a wall. The external panel 110 can be mounted over the control module 120, so as to form a façade or shell over the mounted control module 120. As shown by an example of FIG. 1B, the control device 100 can be installed as a light switch that electrically connects to one or more connected devices 25 (e.g., illumination devices or 'lights') and/or target device(s) 30.

According to examples, the control module 120 includes components for implementing touch sensing functionality at any location of the exterior panel 110, including on perimeter and corner regions of the exterior panel 110. The control module can respond to touch-inputs by signaling commands or control output signals to control switching and/or settings for operating lights 25 and/or other connected target device(s) 30.

In some examples, the control module 120 interprets touch-input by (i) identifying locations on the exterior panel 110 where the touch occurred, and (ii) interpreting the touch as a particular type of input (e.g., gesture input). By identifying the locations on the exterior panel 110 where touch-input occurred, the control module 120 can modulate the sensitivity of the detection, so as to better detect touch-input on regions of the exterior panel which do not overlay sensing elements of the control module 120.

The control module 120 can implement a control operation or function in response to detecting and interpreting touch-input. For connected lights, the control operation or function can include (i) switching the connected light(s), (e.g., from on to off or vice versa), and (ii) dimming the connected light from high-to-low or low-to-high. For other target devices, the control operation can include communicating wirelessly to switch the target device power state and/or implement a setting or other control parameter (e.g., raise volume).

In some examples, the control module 120 distinguishes different touch-inputs and further selects commands or output signals based on the type of touch-input and/or attributes of the detected touch-input. In examples, the control module 120 can define a gesture based on one or more characteristics of the touch-input, including characteristics of (i) an amount of movement which occurred when the user contacted the panel 110, (ii) a path or linearity of the movement, (iii) a duration in time of the contact; (iv) a location on the panel where the touch was detected (or initiated and/or completed); and/or (v) whether another touch was detected on the external panel 110 within a following time interval upon removal of a prior touch or contact with the external panel 110 (e.g., such as in the case of a double tap). Additionally, in variations, the control module 120 can determine which control operations to perform based on the detected gesture and a scene or setting associated with the detected gesture.

As described with various examples, the control device 100 can detect and respond to touch-input that is received at any location along the surface of the panel 110. Accordingly, the control device 100 can receive and interpret touch-input based on the attributes of the touch-input, where the characteristics include (as described in other examples) distance of touch travel (or starting and completion points), path of touch travel, duration of touch travel, etc. Additionally, as the control device 100 is "touch-anywhere" responsive, the control module 120 can (i) interpret a user gesture, and/or (ii) select a scene (e.g., predetermined settings or actions to perform) or operation to perform based on the detected location(s) of the touch-input.

Figures 2A, 2B:
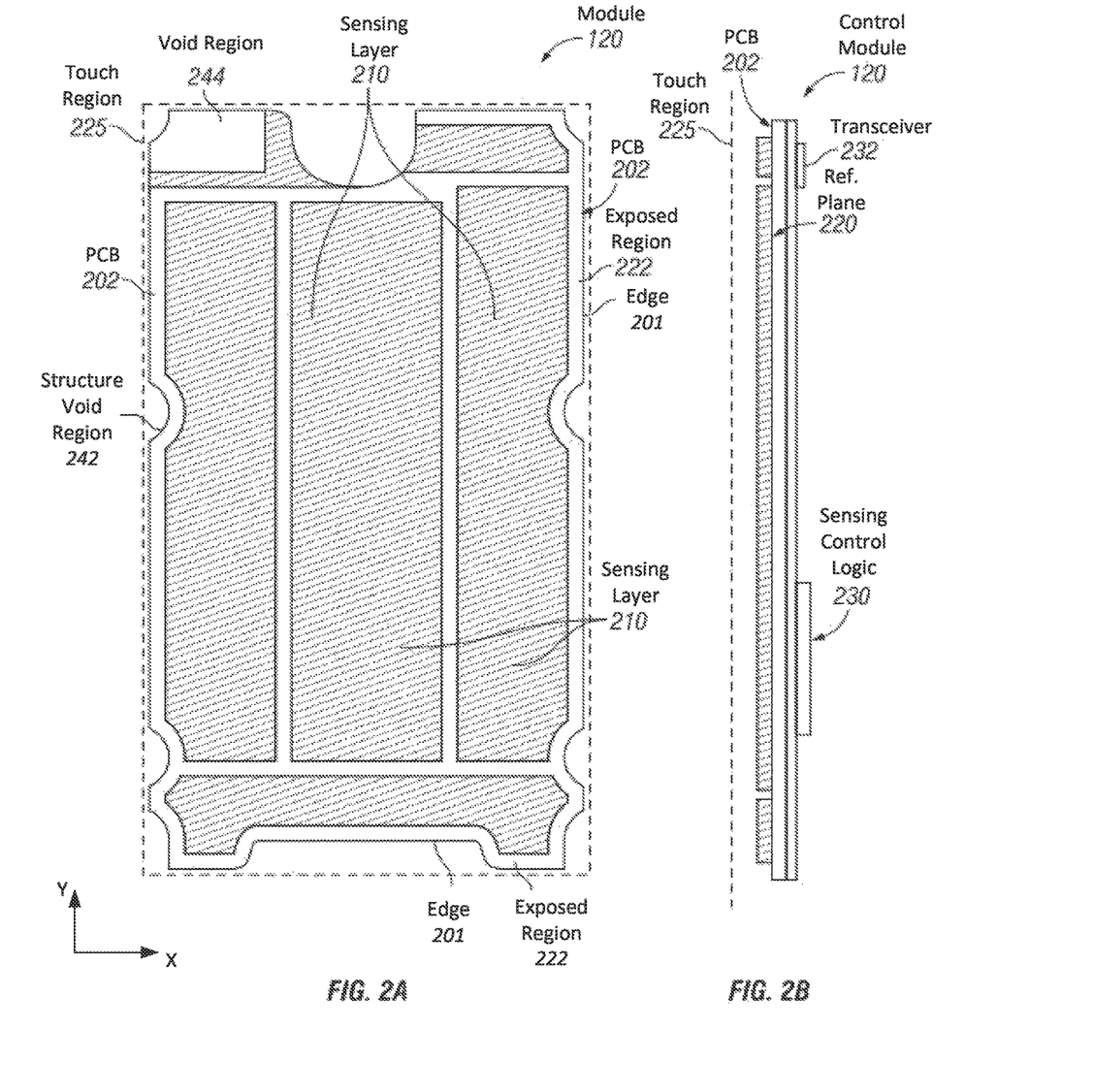
FIG. 2A through FIG. 2C illustrate a control module of a touch-based control device, according to one or more examples.
Figure 2C:
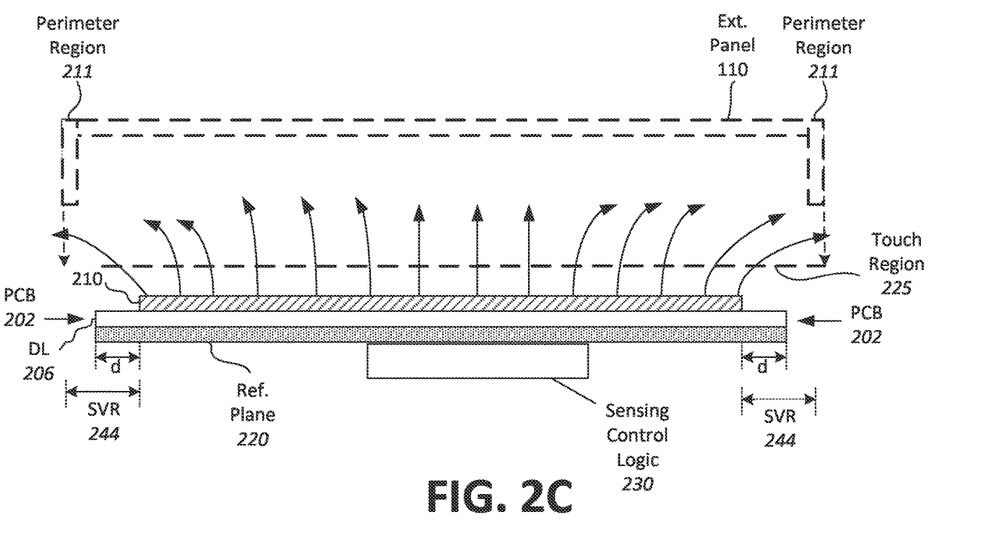

FIG. 2A through FIG. 2C illustrate the control module 120 structured to enable control device 100 to sense touch-input on any location of the exterior panel 110, according to one or more examples. FIG. 2A is a front view of a printed circuit board (PCB) 202 for control module 120, according to one or more examples. FIG. 2B is a side view of the PCB 202 of FIG. 2A. FIG. 2C is a bottom view of the control device 100 along lines A-A, according to one or more examples.

With reference to FIG. 2A and FIG. 2B, control module 120 includes a PCB 202 having a sensing layer 210, a reference plane 220 on which the sensing layer 210 is formed, and sensing control logic 230 to detect and interpret sensor values detected by the sensing layer 210. The sensing layer 210 can be formed from conventional PCB fabrication techniques, such as by etching sensors into copper foil. In some examples, the reference plane 220 is a copper grounding plane. The sensing control logic 230 can be implemented through, for example, a microprocessor that is electrically connected to the sensing elements of the sensing layer 210. As shown, the sensing control logic 230 can be implemented by, for example, a microprocessor that is provided on a back side of the PCB 202, along with other components (e.g., wireless transceiver 232), circuit elements, and electrical interface (not show).

When installed, the exterior panel 110 can mount directly over or in close proximity to the sensing layer 210, such that the individual sensing elements of the sensing layer 210 can detect fluctuations in an electric field caused by introduction of a capacitive object, such as a human finger which inherently carries capacitance. With reference to FIG. 2A, a touch region 225 can represent an overlay region of the exterior panel 110, coinciding with the region of the exterior panel 110 where touch-input can be detected and interpreted. As shown by FIG. 2A, the touch region 225 can encompass one or multiple regions that extend over regions where no capacitive sensing elements are provided. For example, the PCB 202 may include one or more structure void regions 242, corresponding to a shape or other structural feature (e.g., through-hole) of the PCB 202 where no sensing elements exist. As an addition or variation, the touch region 225 can extend over the one or more perimeter regions 246, which can extend beyond a perimeter edge of the PCB to encompass, for example, a perimeter edge or thickness of the external panel 110. In such examples, the control module 120 may still detect and interpret touch-input of the user, even when the touch-input does not directly overlay the sensing elements of the sensing layer 210, such as in the case when the touch-input is at or near an edge region of the exterior panel 110 so as to directly overlay an area that is beyond the perimeter edge 201 of the PCB 202.

Still further, in some implementations, the reference plane 220 can include one or more sensor void regions 244 that are intended to accommodate design aspects of the sensing layer 210. For example, the control module 120 can include a sensor void region 244 where no sensing elements are provided, so as to prevent interference with an antenna element of a wireless transceiver 234.

With reference to FIG. 2C, the PCB 202 includes sensing layer 210, a dielectric layer 206, and a reference plane 220. The reference plane 220 can be exposed ("exposed reference plane regions 222") on a perimeter region 246, with the sensing layer 210 and dielectric layer 206 having a relatively reduced dimension (as represented by d) as compared to the reference plane 220. Examples recognize that exposure of the reference plane 220 at select locations (e.g., such as near the perimeter region) causes the electric field overlaying the sensing elements of the sensing layer 210 to skew directionally, to better overlay the perimeter regions 246, which can extend beyond the perimeter edge 201 of the PCB 202 to encompass a perimeter corner or edge of the external panel 110. In such examples, touch-input received on the external panel 110 on or near a corner or perimeter region 211 is detectable and interpretable by the sensing control logic 230. In contrast, under conventional approaches, the perimeter regions 246 would be blind spots on the external panel 110, coinciding with locations where touch-input would be undetectable.

Accordingly, with reference to FIG. 2A through FIG. 2C, in order to allow for touch responsiveness over the entire touch region 225, examples can further provide for the PCB 202 to be structured so as to selectively expose the reference plane 220, to cause the electric field used by sensing elements that are adjacent to the exposed reference plane to be influenced in shape (e.g., bend, arc) by the exposed reference plane regions 222. In particular, examples provide for exposing the reference plane 220 about or near regions of the PCB 202 where no sensing elements are provided, such as about structure void regions 242, sensor void regions 244 and perimeter regions 246. The selective exposure of the reference plane 220 causes a greater portion of the electric field that is used by the proximate and/or adjacent sensing elements to shift laterally over and beyond the exposed reference plane regions, so as to increase the overlay of the electric fields over the structure void regions 242, sensor void regions 244 and/or perimeter regions 246. In this manner, the shifting of the electric field enables touch-input that occurs over the respective structure void regions 242, sensor void regions 244 and/or perimeter regions 246 to be detectable by the respective proximate sensing elements, such that, for example, an output of the respective proximate sensing elements is distinguishable (or more distinguishable) from a baseline reference signal that is otherwise generated by the proximate sensing elements when no touch-input occurs.

Additionally, examples provide that the sensing control logic 230 can implement logic that is specific to a particular area or location of contact on the exterior panel. In some examples, the sensitivity of the sensing control logic 230 in how it interprets raw sensor data generated from the sensing layer 210 can be tuned based on the location (e.g., X/Y coordinates) of the touch contact. For example, to detect touch contact that occurs over structure void regions 242, sensor void regions 244, and/or perimeter regions 246, the sensing control logic 230 can implement a lower threshold variance as between the detected capacitance and a baseline level for sensing layer 210. Moreover, the sensing control logic 230 may determine different types of touch-input based on the location of the touch contact (e.g., X/Y coordinate). For example, the sensing control logic 230 may detect a touch-input as a stroke or movement when the touch-input overlaps with the groove 116. As another example, the sensing control logic 230 can detect a touch-input as a tap, or double tap, when the touch-input occurs over one of the structure void regions.

Figure 3:
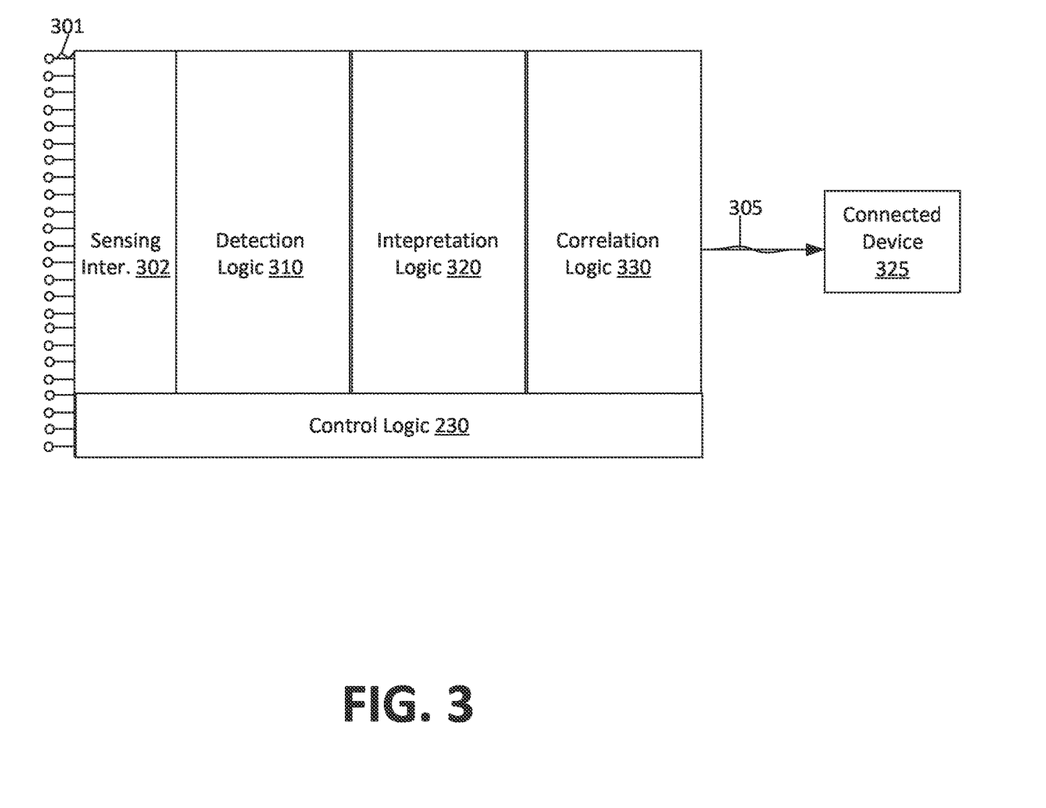
FIG. 3 illustrates sensing control logic for a control module of a touch-based control device, according to one or more examples.

FIG. 3 illustrates an implementation of sensing control logic 230, according to one or more examples. In examples, sensing control logic 230 includes an interface 302 which can receive multiple sensor signals 301, with each sensor signal 301 corresponding to an output of a respective sensing element. In some examples, the sensing control logic 230 continuously receives sensor signals 301 from the sensing layer 210, where each sensor signal 301 is generated by a sensor element or discrete portion of sensing layer 210. Accordingly, each sensor signal 301 can be associated with at least one location (e.g., coordinate) of touch region 225. Each sensor signal 301 can correspond to, for example, capacitance signals generated by an electric field above a corresponding sensing element or portion of the sensing layer 210. Without any touch-input, the sensing elements of sensing layer 210 continuously generate a baseline or noise signal, and when touch-input occurs, the sensor signals 301 that are impacted by the touch-input reflect a change as compared to the baseline signal.

In examples, the sensing control logic 230 includes detection logic 310 which can continuously monitor the sensor signals 301 to detect the occurrence of a touch-input. The detection logic 310 can detect a touch-input as a change in a value of one or more sensor signals 301, where the change is in reference to the baseline or noise signal value for the sensing element. In examples, the detection logic 310 can register a touch-input when the value of one or more sensor signals 301 varies from the baseline by more than a given minimum threshold ("touch trigger threshold").

In variations, the detection logic 310 can implement additional conditions for registering changes in values of the sensor signals 301 as touch-input. By way of examples, the additional conditions can include (i) a minimum threshold number of sensing elements that generate sensor signals 301 which vary from the baseline by more than the touch trigger threshold area; and (ii) a minimum threshold time interval during which the change in the sensor signals 301 was detected.

Additionally, in detecting touch-inputs, the detection logic 310 can implement calibration or sensitivity adjustments that are specific to the location of a sensing element. The calibration or sensitivity adjustments can be made in context of determining whether a value of a sensor signal 301, individually or in combination with other signals, is indicative of touch input as opposed to noise. In examples, the detection logic 310 incorporate calibration or sensitivity adjustments for sensor signals 301 of sensing elements that are adjacent or proximate to a location of the touch region 225 which does not directly overlay any sensing element. For example, sensor signals 301 that are generated adjacent or proximate to one of the structure void regions 242, sensor void regions 244 and/or perimeter regions 246 of the circuit board can be calibrated to reflect greater sensitivity as compared to sensor signals 301 that are generated from a region of the sensor layer which directly coincided with presence of one or multiple sensing elements. The detection logic 310 can, for example, vary the touch trigger threshold for individual sensing elements based on the location of the respective sensing elements, with the touch trigger threshold being less for those sensing elements that are proximate to one of the structure void regions 242, sensor void regions 244 and/or perimeter regions 246. In this way, the detection logic 310 can be more sensitive to touch-inputs which occur on locations of the touch region 225 that do not, for example, overlay a sensing element (e.g., location beyond perimeter edge of PCB 202).

Still further, some examples recognize that a touch-input can impact the sensor signals 301 of multiple sensing elements (e.g., cluster) at one time, and over a given time interval during which the touch-input occurred, the number of sensing elements and the degree to which they are impacted may range based on attributes of the touch-input. In determining whether touch input occurs, detection logic 310 can process the sensor signals 301 for attributes which are indicative of a potential touch event, and the attributes can be analyzed to determine whether a touch input occurred. The attributes can reflect, for example, (i) the number of sensing elements which are impacted by a touch-input, (ii) the variation amongst the modulated sensor signals 301, (iii) the degree and/or duration to which the sensor signals 301 are modulated, and/or (iv) the location of the sensing elements that generated the modulated sensor signals 301. The detection logic 310 can incorporate calibration or sensitivity adjustments based on the location of the sensing elements from which respective modulated sensor signal 301 are detected. In some examples, the calibration or sensitivity adjustments can include weighting one or more attributes that are determined from sensing signals 301 that are near a void or perimeter region where no other sensing element is provided. As an addition or variation, the detection logic 310 can pattern match detected attributes of sensor signals 301, such as by (i) representing attributes of a number of modulated signals as a feature vector, and (ii) comparing the determined feature vector with known feature vectors that are labeled to reflect input or no input (or alternatively, a particular type of input). In this way, the detection logic 310 can associate a touch-input that includes attributes such as the location of the touch-input at multiple instances of time during an interval when the touch-input was detected.

In examples, the sensing control logic 230 may also include touch interpretation logic 320, which can associate the detected attributes associated with the touch-input with an input type and/or value. By way of example, the determined input types or values can correspond single-tap, double-tap, long touch, slide or swipe, etc. In some variations, the input type and/or value can also be associated with one or more location values. For example, a touch-input in a first region of the touch region 225 may be interpreted differently as compared to the same touch-input in a second region of the touch region 225.

In examples, the sensing control logic 230 can include correlation logic 330 to correlate the sensor change value, the detected attributes and the input type to an output signal 305. The output signal 305 can be selected for one of multiple connected devices 325 (e.g., light(s) 25, target device(s) 30). Additionally, the output signal 305 can specify a setting or command based on the connected device 325. In some variations, the output signal can be specific to the type or functionality of the connected device 325.

Methodology

Figure 4:
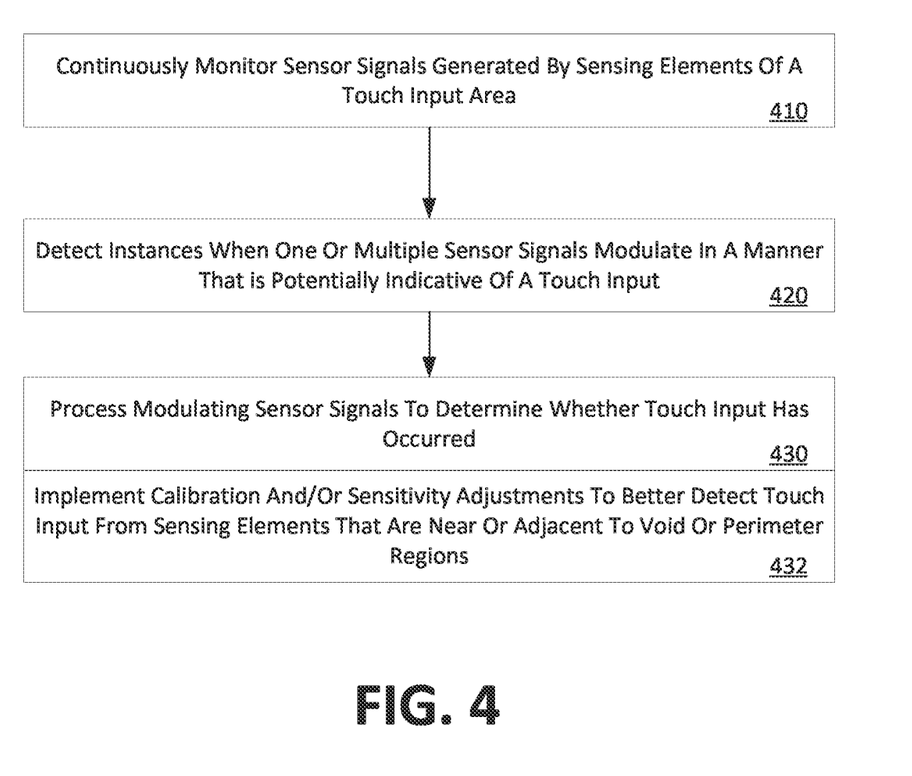
FIG. 4 illustrates an example method for operating a touch-based control device, according to one or more examples.

FIG. 4 illustrates a method of operating a touch-based control device, according to one or more examples. In describing an example of FIG. 4, reference may be made to elements described with FIG. 1A, FIG. 1B, FIG. 2A, FIG. 2B and FIG. 3, for purpose of illustrating suitable elements for performing a step or sub-step being described, According to examples, the control module 120 continuously monitors sensor signals 301 generated by sensing elements of the sensing layer 210 (410). The control module 120 can further detect instances when one or multiple sensor signals 301 modulate in a manner that is potentially indicative of a touch-input (420). For example, the control module 120 can detect when the modulating sensor signal(s) 301 exceed a corresponding baseline value by an amount which exceeds the touch trigger threshold.

The control module 120 can process the modulating sensor signals 301 to determine whether a touch input has occurred (430). Further, in making the determination, the control module 120 can implement calibration and/or sensitivity adjustments that are based on the location of the sensor signals 301 (432). In particular, the control module 120 can implement the calibration and/or sensitivity adjustments so that modulated sensor signals 301, resulting from one or multiple sensing elements that are adjacent to a void or perimeter region, can properly be detected and interpreted as touch input.

As an addition or alternative, the control module 120 can analyze modulating sensor signal(s) 301 to identify attributes that include (i) a number of modulating sensing elements, (ii) the variation amongst the modulated sensor signals 301, (iii) the degree and/or duration to which the sensor signals 301 are modulated, and (iv) the location of the modulated sensor signals 301. Additionally, the control module 120 can weight attributes determined from sensing elements that are proximate or adjacent void or perimeter regions to reflect more sensitivity, so as to better detect touch-input that occurs over a void or perimeter region.

Among other advantages, examples such as described with FIG. 4 and elsewhere in this application enable touch input to be detected at any location of a touch input region, without so-called blind spots that would otherwise hinder responsiveness under conventional approaches.

It is contemplated for examples described herein to extend to individual elements and concepts described herein, independently of other concepts, ideas or systems, as well as for examples to include combinations of elements recited anywhere in this application. Although examples are described in detail herein with reference to the accompanying drawings, it is to be understood that the concepts are not limited to those precise examples. As such, many modifications and variations will be apparent to practitioners skilled in this art. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mention of the particular feature. Thus, the absence of describing combinations should not preclude claiming rights to such combinations.

What is claimed is:

1. A touch-based control device comprising:
   an interior housing;
   a circuit board;
   a sensor layer including a plurality of sensing elements that are positioned to modulate their respective sensing signals in response to touch input on an exterior panel that overlays the sensor layer; and
   a control module provided within the interior housing, the control module including control logic to determine whether modulating sensor signals generated by a set of sensing signals of the plurality of sensing elements vary from a corresponding baseline signal by more than a corresponding minimum threshold;
   wherein the control logic determines the corresponding minimum threshold for the modulating sensor signals based on a location of one or more sensing elements of the set of sensing elements, the one or more sensing elements being adjacent or proximate to a sensor void region of the circuit board and/or a perimeter region that extends beyond a perimeter edge of the circuit board;
   wherein the control module generates one or more output signals to control one or more connected devices based on the touch input.

2. The touch-based control device of claim 1, wherein the control device is a wall-mountable controller for a dwelling.

3. The touch-based control device of claim 1, wherein the control module generates one or more output signals to control one or more wired connected devices.

4. The touch-based control device of claim 1, wherein the control module generates one or more output signals to wirelessly control one or more wireless and connected devices.

5. The touch-based control device of claim 1, wherein the one or more connected devices include one or more lights, and wherein the one or more output signals control a power level, brightness level, hue, or blink pattern of the one or more lights.

6. The touch-based control device of claim 1, wherein the one or more output signals control an operational setting of the one or more connected devices.

7. The touch-based control device of claim 1, wherein the control module varies a sensitivity of the sensing elements for different locations across the exterior panel.

8. The touch-based control device of claim 1, wherein the minimum threshold is specific to each of the one or more modulating sensor signals.

9. The touch-based control device of claim 1, wherein the circuit board includes a reference plane, and wherein the circuit board selectively exposes the reference plane adjacent to the sensor void region or the perimeter region.

10. A non-transitory computer readable medium storing instructions that, when executed by a control module of a touch-based control device, cause the control module to:
    detect a touch input performed on an exterior panel of the touch-based control device, the exterior panel overlaying an interior housing of the touch-based control device, the interior region including a circuit board;
    wherein a minimum threshold of at last one modulating sensor signal is based on the respective sensing element being adjacent or proximate to a sensor void region of the circuit board and/or a perimeter region that extends beyond a perimeter edge of the circuit board; and based on the touch input, generate one or more output signals to control one or more connected devices.

11. The non-transitory computer readable medium of claim 10, wherein the control device is a wall-mountable controller for a dwelling.

12. The non-transitory computer readable medium of claim 10, wherein the control module generates one or more output signals to control one or more wired connected devices.

13. The non-transitory computer readable medium of claim 10, wherein the control module generates one or more output signals to wirelessly control one or more wireless and connected devices.

14. The non-transitory computer readable medium of claim 10, wherein the one or more output signals control an operational setting of the one or more connected devices.

15. The non-transitory computer readable medium of claim 10, wherein the control module varies a sensitivity of the touch detection for different locations across the exterior panel.

16. The non-transitory computer readable medium of claim 10, wherein the minimum threshold is specific to each of the at least one modulating sensor signals.

17. A computer-implemented method of operating a touch-based control device, the method being performed by a control module of the touch-based control device and comprising:

detecting a touch input performed on an exterior panel of the touch-based control device, the exterior panel overlaying an interior housing of the touch-based control device the interior region including a circuit board;

wherein a minimum threshold of at last one modulating sensor signal is based on the respective sensing element being adjacent or proximate to a sensor void region of a circuit board and/or a perimeter region that extends beyond a perimeter edge of the circuit board; and based on the touch input, generating one or more output signals to control one or more connected devices.

18. The method of claim 17, wherein the control device is a wall-mountable controller for a dwelling.

19. The method of claim 17, wherein the control module generates one or more output signals to control one or more wired connected devices.

20. The method of claim 17, wherein the control module generates one or more output signals to wirelessly control one or more wireless and connected devices.

21. The method of claim 17, wherein the one or more output signals control an operational setting of the one or more connected devices.

22. The method of claim 17, wherein a sensitivity of the touch detection for different locations across the exterior panel.

23. The method of claim 17, wherein the minimum threshold is specific to each of the at least one modulating sensor signals.

* * * * *